US009634104B2

(12) United States Patent
Chao et al.

(10) Patent No.: US 9,634,104 B2

(45) Date of Patent: Apr. 25, 2017

(54) FINFET AND METHOD OF FABRICATING THE SAME

(71) Applicant: TAIWAN SEMICONDUCTOR MANUFACTURING COMPANY, LTD., Hsinchu (TW)

(72) Inventors: Donald Y. Chao, Zhubei (TW); Hou-Yu Chen, Zhubei (TW); Shyh-Horng Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/711,170

(22) Filed: May 13, 2015

(65) Prior Publication Data

US 2015/0249138 A1 Sep. 3, 2015

Related U.S. Application Data

(60) Continuation of application No. 14/156,580, filed on Jan. 16, 2014, now Pat. No. 9,053,934, which is a (Continued)

(51) Int. Cl.
*H01L 29/417* (2006.01)
*H01L 29/78* (2006.01)
(Continued)

(52) U.S. Cl.
CPC .. *H01L 29/41791* (2013.01); *H01L 21/02532* (2013.01); *H01L 21/02636* (2013.01);
(Continued)

(58) Field of Classification Search
CPC ... H01L 21/845; H01L 29/78; H01L 29/7831; H01L 29/785; H01L 29/41791;
(Continued)

(56) References Cited

U.S. PATENT DOCUMENTS 5,043,300 A * 8/1991 Nulman ............ H01L 21/28518 257/E21.165
5,874,342 A * 2/1999 Tsai .................... H01L 21/2257 257/384

(Continued)

FOREIGN PATENT DOCUMENTS

KR 10-2010-0073601 A * 10/2010 ........... H01L 21/336
KR 10-2011-0036505 4/2011
KR 10-2011-0098594 9/2011

OTHER PUBLICATIONS

Mel et al., English Machine Translated of KR Application No. 10-2010-0073601.*
Office Action dated Jun. 25, 2013 and English translation from corresponding application No. KR 10-2012-005439.

*Primary Examiner* — John C Ingham
*Assistant Examiner* — Gustavo Ramallo
(74) *Attorney, Agent, or Firm* — Haynes and Boone, LLP

(57) ABSTRACT

A method of fabricating a fin field effect transistor (FinFET) includes forming a first fin and a second fin extending upward from a substrate major surface to a first height, forming an insulation layer comprising a top surface extending upward from the substrate major surface to a second height less than the first height, selectively forming a bulbous epitaxial layer covering a portion of each fin, annealing the substrate to convert at least a portion of the bulbous epitaxial layer to silicide and depositing a metal layer at least in the cavity. The first fin and the second fin are adjacent. A portion of the first fin and a portion of the second fin extend beyond the top surface of the insulation layer. The bulbous epitaxial layer defines an hourglass shaped cavity between adjacent fins.

19 Claims, 14 Drawing Sheets

250
270
262
262
260
260
260
216
216
216
202

Related U.S. Application Data division of application No. 13/363,003, filed on Jan. 31, 2012, now Pat. No. 8,659,032.

(51) Int. Cl.
*H01L 29/66* (2006.01)
*H01L 21/02* (2006.01)
*H01L 21/324* (2006.01)
*H01L 21/8238* (2006.01)

(52) U.S. Cl.
CPC ...... *H01L 21/02664* (2013.01); *H01L 21/324* (2013.01); *H01L 21/823814* (2013.01); *H01L 29/66795* (2013.01); *H01L 29/785* (2013.01)

(58) Field of Classification Search
CPC ......... H01L 29/66795; H01L 21/02532; H01L 21/02636; H01L 21/02664; H01L 21/324; H01L 21/823814
See application file for complete search history.

(56) References Cited

U.S. PATENT DOCUMENTS 6,319,728 B1 * 11/2001 Bhan ...................... C23C 16/18 257/E21.591
7,300,837 B2 * 11/2007 Chen ................ H01L 29/66628 257/E21.43
7,554,165 B2 6/2009 Hokazono
2010/0224943 A1 9/2010 Kawasaki
2011/0079829 A1 4/2011 Lai et al.
2011/0210404 A1 9/2011 Su et al.
2011/0298058 A1 * 12/2011 Kawasaki .......... H01L 29/7853 257/401
2012/0282743 A1 11/2012 Saitoh et al.
2013/0154026 A1 6/2013 Alptekin et al.
2014/0065782 A1 * 3/2014 Lu ........................ H01L 29/785 438/294

* cited by examiner

200

FINFET AND METHOD OF FABRICATING THE SAME

PRIORITY CLAIM

The present application is a continuation of U.S. application Ser. No. 14/156,580, filed Jan. 16, 2014, which is a divisional of U.S. application Ser. No. 13/363,003, filed Jan. 31, 2012, now U.S. Pat. No. 8,659,032, issued Feb. 25, 2014, which are incorporated by reference herein in their entireties.

TECHNICAL FIELD

The disclosure relates to integrated circuit fabrication and, more particularly, to a fin field effect transistor (FinFET).

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in source/drain (S/D) portions of the FinFET utilizing selectively grown silicon germanium (SiGe) may be used to enhance carrier mobility.

However, there are challenges to implementation of such features and processes in complementary metal-oxide-semiconductor (CMOS) fabrication. For example, non-uniform distribution of silicide on strained materials causes high contact resistance of source/drain regions of the FinFET, thereby degrading the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
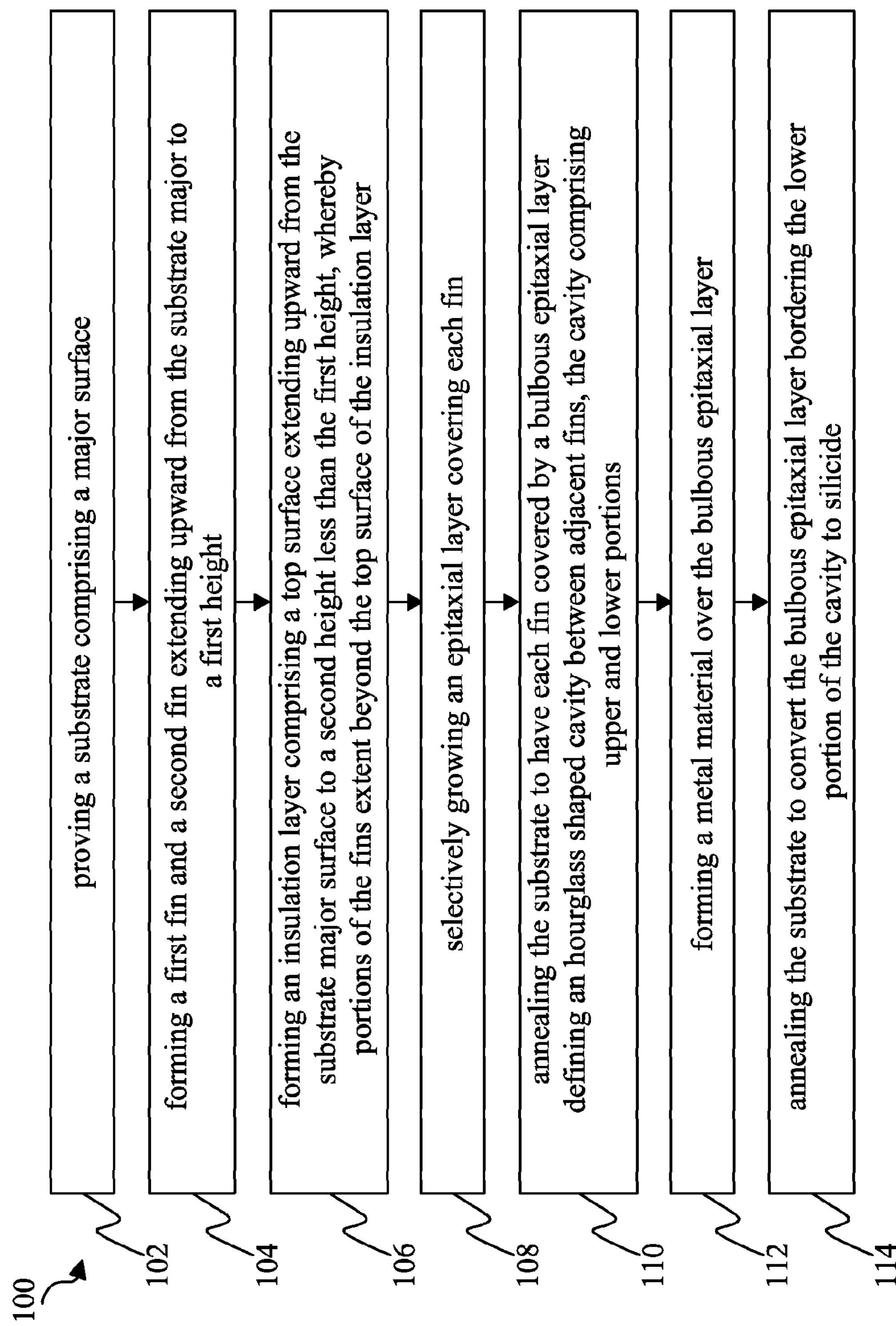
FIG. 1 is a flowchart illustrating a method of fabricating a FinFET according to at least one embodiment of the present disclosure.

It is understood that the following description provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a fin field effect transistor (FinFET) according to at least one embodiment of the present disclosure. The method 100 begins with step 102 in which a substrate comprising a major surface is provided. The method 100 continues with step 104 in which a first fin and a second fin are formed extending upward from the substrate major surface to a first height. The method 100 continues with step 106 in which an insulation layer comprising a top surface is formed extending upward from the substrate major surface to a second height less than the first height, whereby portions of the fins extend beyond the top surface of the insulation layer. The method 100 continues with step 108 in which an epitaxial layer is selectively grown covering each fin. The method 100 continues with step 110 in which the substrate is annealed to have each fin covered by a bulbous epitaxial layer defining an hourglass shaped cavity between adjacent fins, the cavity comprising upper and lower portions. The method 100 continues with step 112 in which a metal material is formed over the bulbous epitaxial layer. The method 100 continues with step 114 in which the substrate is annealed to convert the bulbous epitaxial layer bordering the lower portion of the cavity to silicide. The discussion that follows illustrates embodiments of FinFETs that can be fabricated according to the method 100 of FIG. 1.

FIGS. 2A-14B are perspective and cross-sectional views of a fin field effect transistor (FinFET) 200 at various stages of fabrication according to various embodiments of the present disclosure. As employed in the present disclosure, the FinFET 200 refers to any fin-based, multi-gate transistor. The FinFET 200 may be included in a microprocessor, memory cell, and/or other integrated circuit (IC). It is noted that the method of FIG. 1 does not produce a completed FinFET 200. A completed FinFET 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 2A through 14B are simplified for a better understanding of the concepts of the present disclosure. For example, although the figures illustrate the FinFET 200, it is understood the IC may comprise a number of other devices comprising resistors, capacitors, inductors, fuses, etc.

Figure 2A:
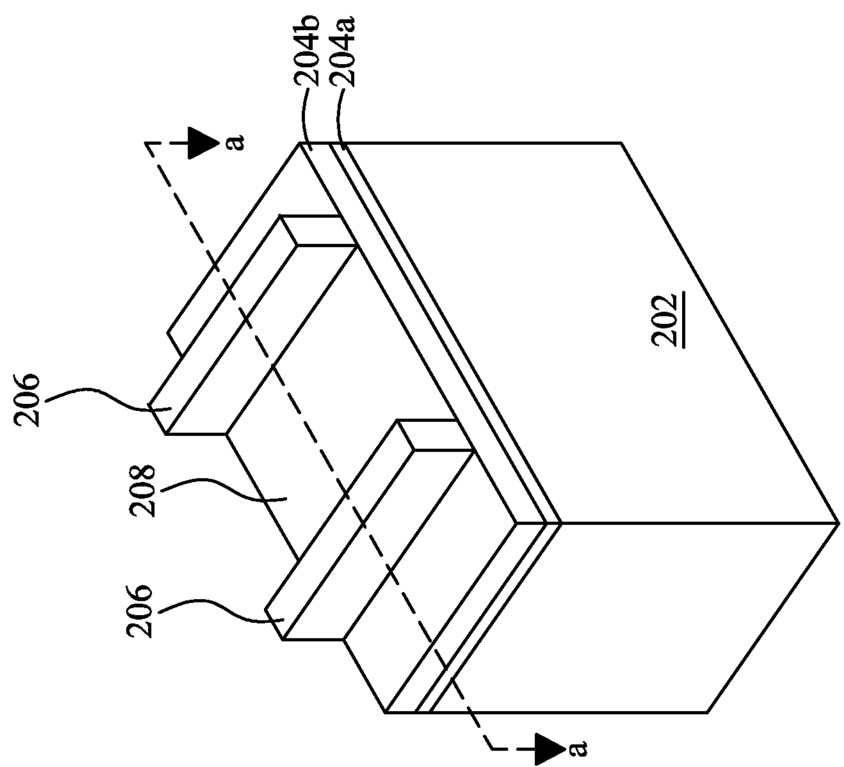
FIGS. 2A-14B are perspective and cross-sectional views of a FinFET at various stages of fabrication according to various embodiments of the present disclosure.
Figure 2B:
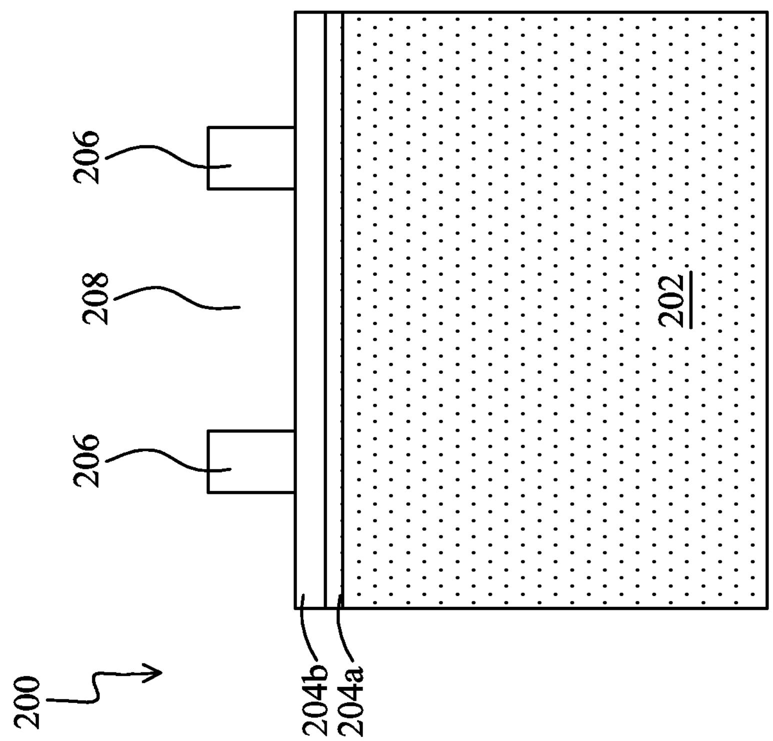

FIG. 2A is a perspective view of the FinFET 200 having a substrate 202 at one of the various stages of fabrication according to an embodiment, and FIG. 2B is a cross-sectional view of a FinFET taken along the line a-a of FIG. 2A. In one embodiment, the substrate 202 comprises a crystalline silicon substrate (e.g., wafer). The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some alternative embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

The fins are formed by etching into the substrate 202. In one embodiment, a pad layer 204*a* and a mask layer 204*b* are formed on the semiconductor substrate 202. The pad layer 204*a* may be a thin film comprising silicon oxide formed, for example, using a thermal oxidation process. The pad layer 204*a* may act as an adhesion layer between the semiconductor substrate 202 and mask layer 204*b*. The pad layer 204*a* may also act as an etch stop layer for etching the mask layer 204*b*. In an embodiment, the mask layer 204*b* is formed of silicon nitride, for example, using low-pressure chemical vapor deposition (LPCVD) or plasma enhanced chemical vapor deposition (PECVD). The mask layer 204*b* is used as a hard mask during subsequent photolithography processes. A photo-sensitive layer 206 is formed on the mask layer 204*b* and is then patterned, forming openings 208 in the photo-sensitive layer 206.

Figure 3A:
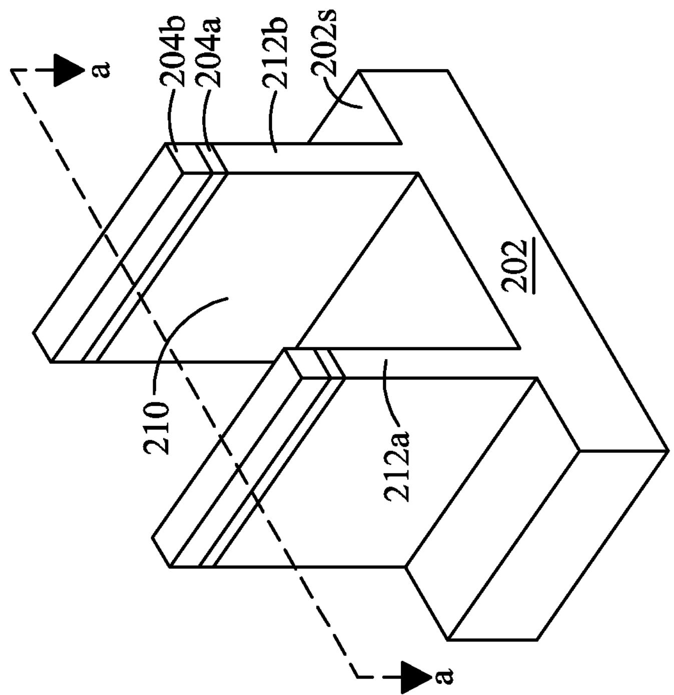
Figure 3B:
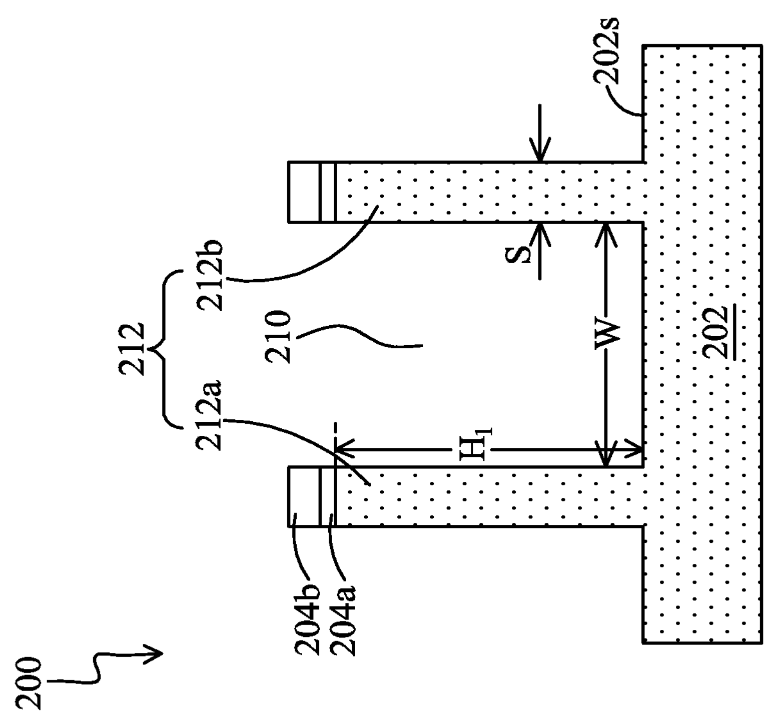

FIG. 3A is a perspective view of the FinFET 200 at one of the various stages of fabrication according to an embodiment, and FIG. 3B is a cross-sectional view of a FinFET taken along the line a-a of FIG. 3A. The mask layer 204*b* and pad layer 204*a* are etched through openings 208 to expose underlying semiconductor substrate 202. The exposed semiconductor substrate 202 is then etched to form trenches 210 with major surfaces 202*s* of the semiconductor substrate 202. Portions of the semiconductor substrate 202 between trenches 210 form semiconductor fins 212. The semiconductor fins 212 comprise a first fin 212*a* and a second fin 212*b* extending upward from the substrate major surface 202*s* to a first height $H_1$. Trenches 210 may be strips (viewed from in the top of the FinFET 200) parallel to each other, and closely spaced with respect to each other. Trenches 210 each has a width W, the first height $H_1$, and is spaced apart from adjacent trenches by a spacing S. For example, the spacing S between trenches 210 may be smaller than about 30 nm. The photo-sensitive layer 206 is then removed. Next, a cleaning may be performed to remove a native oxide of the semiconductor substrate 202. The cleaning may be performed using diluted hydrofluoric (DHF) acid.

In some embodiments, first height $H_1$ of the trenches 210 may range from about 2100 Å to about 2500 Å, while width W of the trenches 210 ranges from about 300 Å to about 1500 Å. In an exemplary embodiment, the aspect ratio ($H_1$/W) of the trenches 210 is greater than about 7.0. In some other embodiments, the aspect ratio may even be greater than about 8.0. In yet some embodiments, the aspect ratio is lower than about 7.0 or between 7.0 and 8.0. One skilled in the art will realize, however, that the dimensions and values recited throughout the descriptions are merely examples, and may be changed to suit different scales of integrated circuits.

Liner oxide (not shown) is then optionally formed in the trenches 210. In an embodiment, liner oxide may be a thermal oxide having a thickness ranging from about 20 Å to about 500 Å. In some embodiments, liner oxide may be formed using in-situ steam generation (ISSG) and the like. The formation of liner oxide rounds corners of the trenches 210, which reduces electrical fields, and hence improves the performance of the resulting integrated circuit.

Figures 4A, 4B:
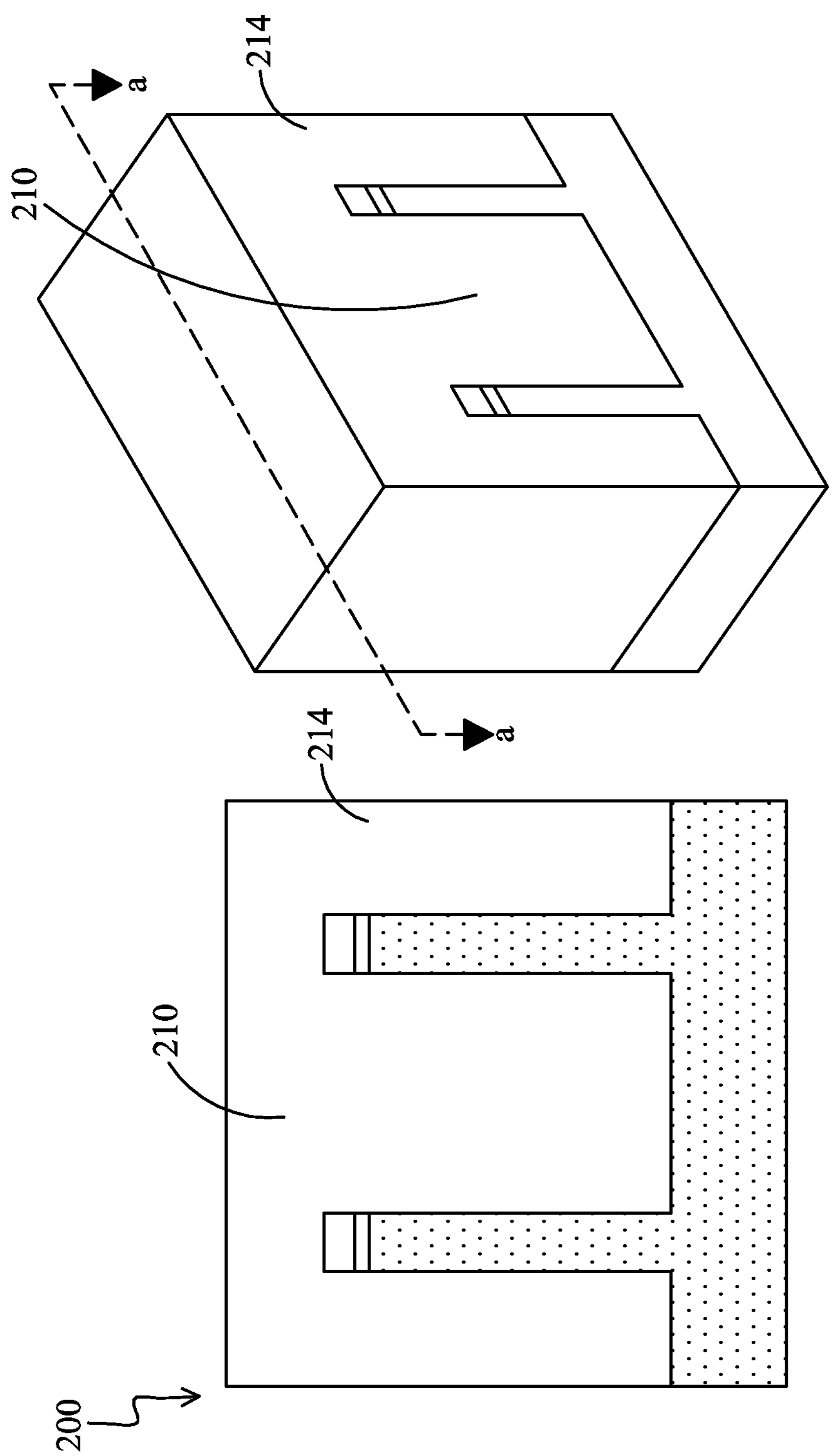

FIG. 4A is a perspective view of the FinFET 200 at one of the various stages of fabrication according to an embodiment, and FIG. 4B is a cross-sectional view of a FinFET taken along the line a-a of FIG. 4A. Trenches 210 are filled with a dielectric material 214. The dielectric material 214 may include silicon oxide, and hence is also referred to as oxide 214 in the present disclosure. In some embodiments, other dielectric materials, such as silicon nitride, silicon oxynitride, fluoride-doped silicate glass (FSG), or a low-K dielectric material, may also be used. In an embodiment, the oxide 214 may be formed using a high-density-plasma (HDP) CVD process, using silane ($SiH_4$) and oxygen ($O_2$) as reacting precursors. In other embodiments, the oxide 214 may be formed using a sub-atmospheric CVD (SACVD) process or high aspect-ratio process (HARP), wherein process gases may comprise tetraethylorthosilicate (TEOS) and ozone ($O_3$). In yet other embodiment, the oxide 214 may be formed using a spin-on-dielectric (SOD) process, such as hydrogen silsesquioxane (HSQ) or methyl silsesquioxane (MSQ).

Figure 5A:
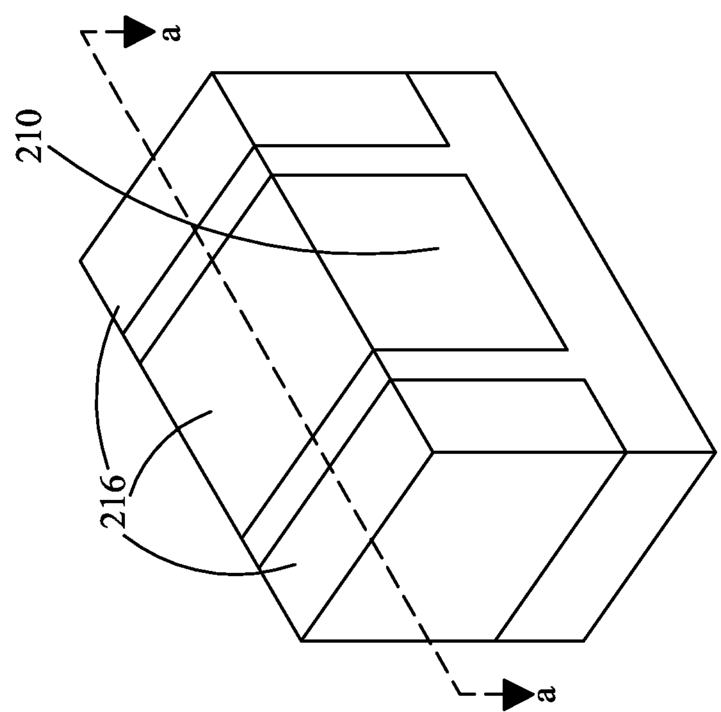
Figure 5B:
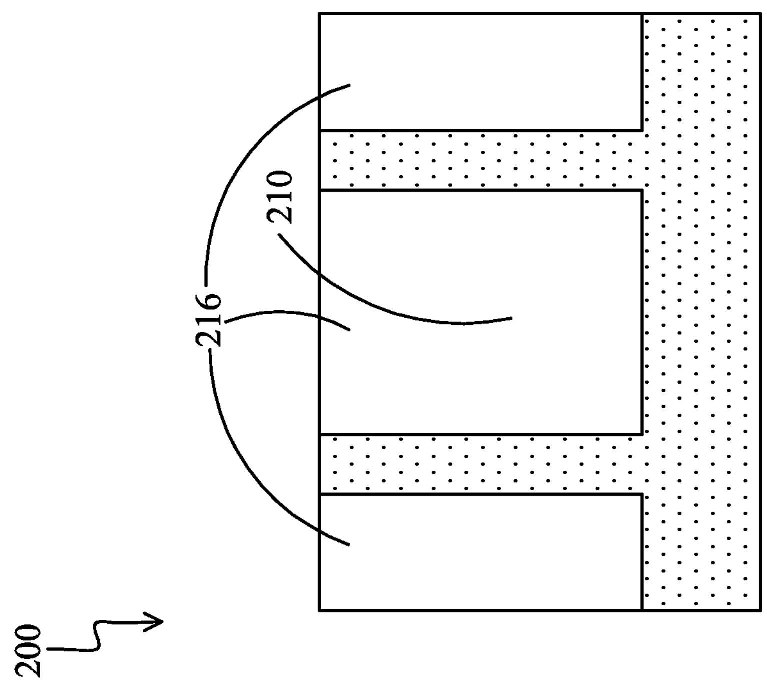
Figures 6A, 6B:
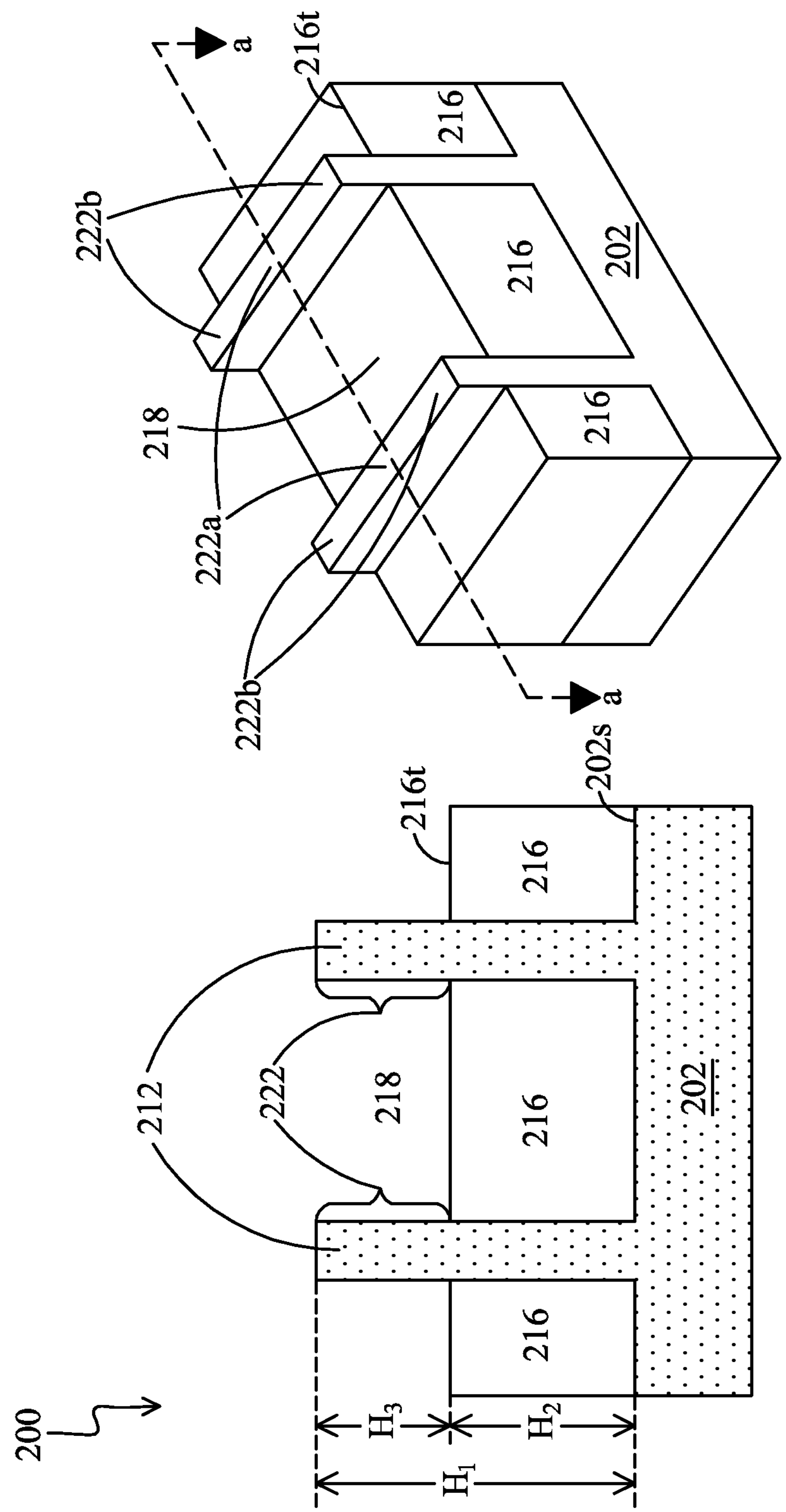

FIGS. 4A and 4B depict the resulting structure after the deposition of the dielectric material 214. A chemical mechanical polish is then performed, followed by the removal of the mask layer 204*b* and pad layer 204*a*. The resulting structure is shown in FIGS. 5A and 5B. FIG. 5A is a perspective view of the FinFET 200 at one of the various stages of fabrication according to an embodiment, and FIG. 5B is a cross-sectional view of a FinFET taken along the line a-a of FIG. 5A. The remaining portions of the oxide 214 in the trenches 210 are hereinafter referred to as insulation layers 216. In one embodiment, the mask layer 204*b* is formed of silicon nitride, the mask layer 204*b* may be removed using a wet process using hot $H_3PO_4$, while pad layer 204*a* may be removed using diluted HF acid, if formed of silicon oxide. In some alternative embodiments, the removal of the mask layer 204*b* and pad layer 204*a* may be performed after the recessing of the insulation layers 216, which recessing step is shown in FIGS. 6A and 6B.

The CMP process and the removal of the mask layer 204*b* and pad layer 204*a* produce the structure shown in FIGS. 5A and 5B. FIG. 6A is a perspective view of the FinFET 200 at one of the various stages of fabrication according to an embodiment, and FIG. 6B is a cross-sectional view of a FinFET taken along the line a-a of FIG. 6A. As shown in FIGS. 6A and 6B, the insulation layers 216 are recessed by an etching step, resulting in recesses 218. In one embodiment, the etching step may be performed using a wet etching process, for example, by dipping the substrate 202 in hydrofluoric acid (HF). In another embodiment, the etching step may be performed using a dry etching process, for example, the dry etching process may be performed using $CHF_3$ or $BF_3$ as etching gases.

The remaining insulation layer 216 comprises a top surface 216*t* extending upward from the substrate major surface 202*s* to a second height $H_2$ less than the first height $H_1$, whereby upper portions 222 of the fins 212 extend beyond the top surface 216*t* of the insulation layer 216. In one embodiment, a ratio of the second height $H_2$ to the first height $H_1$ is from about 0.5 to about 0.8. In the depicted embodiment, the upper portions 222 of the fins 212 may comprise channel portions 222*a* and source/drain (S/D) portions 222*b*. The channel portions 222*a* are used to form channel regions of the FinFET 200. A third height $H_3$ of the upper portion 222 of the fins 212 may be between 15 nm and about 50 nm, although it may also be greater or smaller.

Figures 7A, 7B:
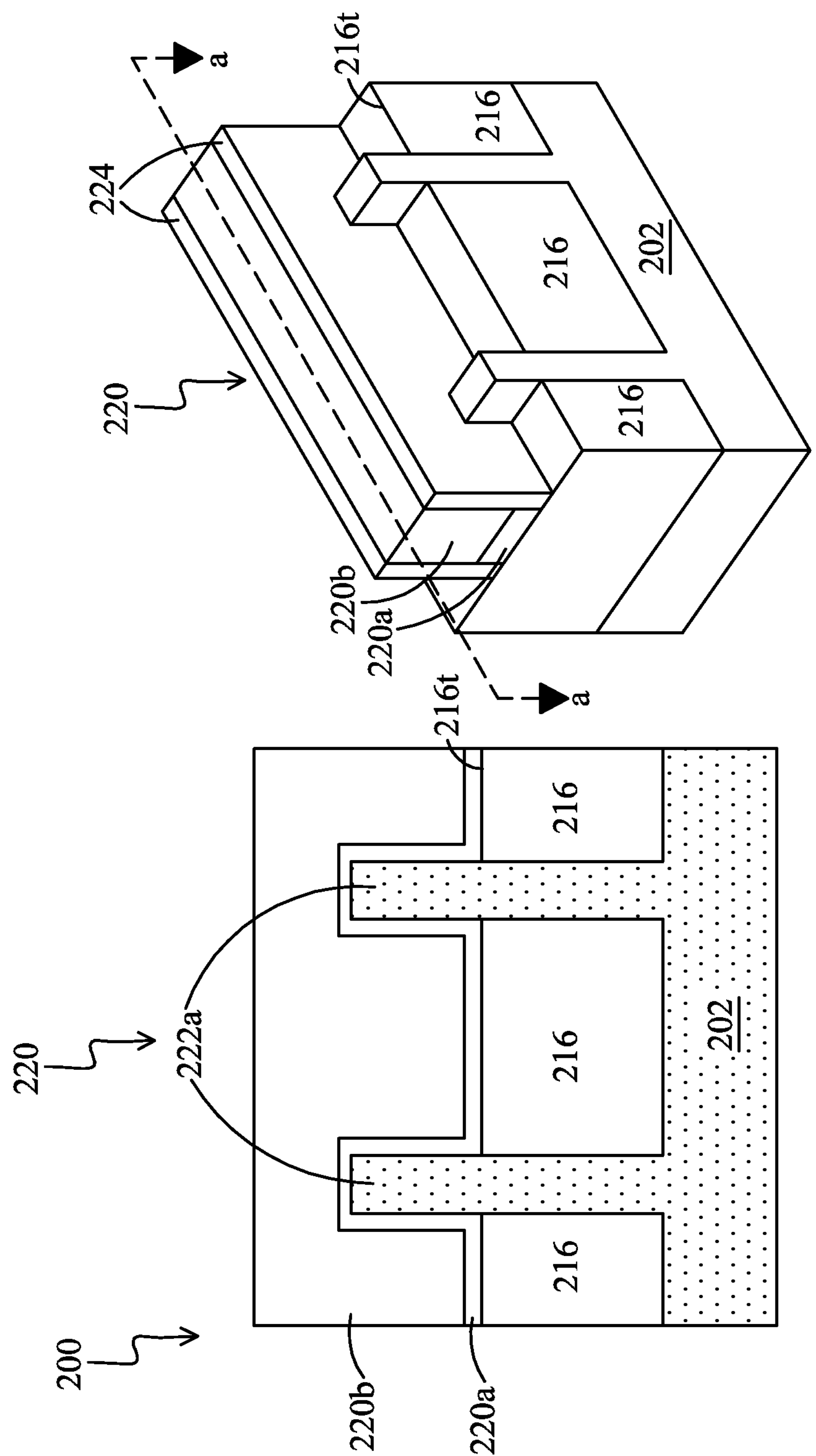

FIG. 7A is a perspective view of the FinFET 200 at one of the various stages of fabrication according to an embodiment, and FIG. 7B is a cross-sectional view of a FinFET taken along the line a-a of FIG. 7A. A gate stack 220 is formed over the channel portions 222*a* of the upper portion 222 of the fins 212 and extending to the top surface 216*t* of the insulation layer 216. In some embodiments, the gate stack 220 typically comprises a gate dielectric layer 220*a* and a gate electrode layer 220*b* over the gate dielectric layer 220*a*.

In FIGS. 7A and 7B, a gate dielectric 220*a* is formed to cover the channel portions 222*c* of the upper portion 222 of the fins 212. In some embodiments, the gate dielectric layer 220*a* may include silicon oxide, silicon nitride, silicon oxynitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 220*a* is a high-k dielectric layer with a thickness in the range of about 10 to 30 angstroms. The gate dielectric layer 220*a* may be formed using a suitable process such as atomic layer deposition (ALD), chemical vapor deposition (CVD), physical vapor deposition (PVD), thermal oxidation, UV-ozone oxidation, or combinations thereof. The gate dielectric layer 220*a* may further comprise an interfacial layer (not shown) to reduce damage between the gate dielectric layer 220*a* and channel portions 222*a* of the upper portions 222 of the fins 212. The interfacial layer may comprise silicon oxide.

The gate electrode layer 220*b* is then formed on the gate dielectric layer 220*a*. In one embodiment, the gate electrode layer 220*b* covers the upper portions 222 of more than one semiconductor fin 212, so that the resulting FinFET 200 comprises more than one fin. In some alternative embodiments, each of the upper portions 222 of the semiconductor fins 212 may be used to form a separate FinFET 200. In some embodiments, the gate electrode layer 220*b* may comprise a single layer or multilayer structure. In the present embodiment, the gate electrode layer 220*b* may comprise polysilicon. Further, the gate electrode layer 220*b* may be doped polysilicon with the uniform or non-uniform doping. In some alternative embodiments, the gate electrode layer 220*b* may include a metal such as Al, Cu, W, Ti, Ta, TiN, TiAl, TiAlN, TaN, NiSi, CoSi, other conductive materials with a work function compatible with the substrate material, or combinations thereof. In the present embodiment, the gate electrode layer 220*b* comprises a thickness in the range of about 30 nm to about 60 nm. The gate electrode layer 220*b* may be formed using a suitable process such as ALD, CVD, PVD, plating, or combinations thereof.

Still referring to FIG. 7A, the FinFET 200 further comprises a dielectric layer 224 formed over the substrate 202 and along the side of the gate stack 220. In some embodiments, the dielectric layer 224 may include silicon oxide, silicon nitride, silicon oxynitride, or other suitable material. The dielectric layer 224 may comprise a single layer or multilayer structure. A blanket layer of the dielectric layer 224 may be formed by CVD, PVD, ALD, or other suitable technique. Then, an anisotropic etching is performed on the dielectric layer 224 to form a pair of spacers on two sides of the gate stack 220. The dielectric layer 224 comprises a thickness ranging from about 5 to 15 nm.

Figures 8A, 8B:
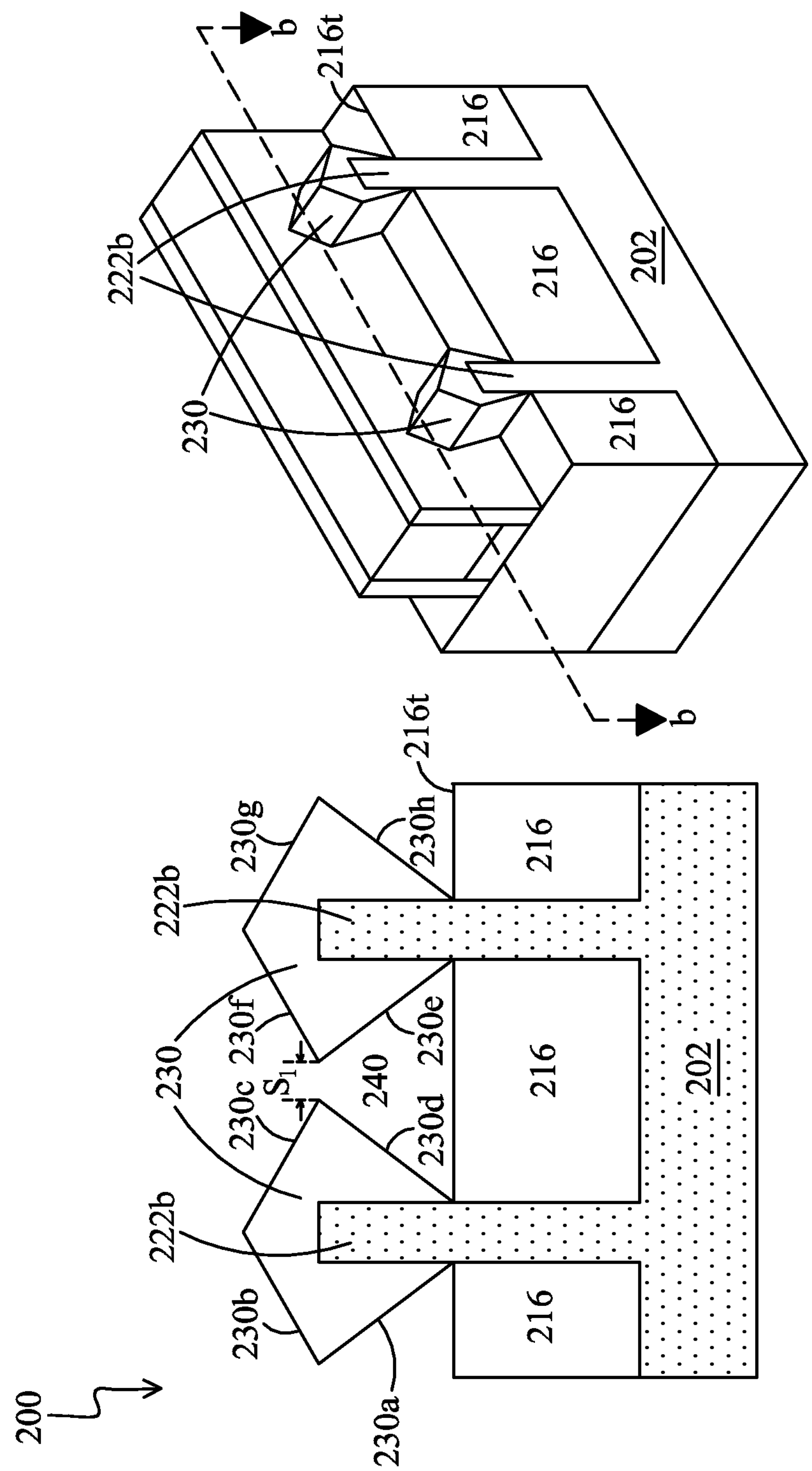

FIG. 8A is a perspective view of the FinFET 200 at one of the various stages of fabrication according to an embodiment, and FIG. 8B is a cross-sectional view of a FinFET taken along the line b-b of FIG. 8A. The structures depicted in FIGS. 8A and 8B are produced by selectively growing an epitaxial layer 230 covering the S/D portions 222*b* of the upper portions 222 of the semiconductor fins 212, whereby the S/D portions 222*b* are not covered by the gate stack 220 and the dielectric layer 224. Since the lattice constant of the epitaxial layer 230 is different from the substrate 202, the channel portions 222*a* of the upper portion 222 of the fins 212 are strained or stressed to enable carrier mobility of the device and enhance the device performance.

Thermodynamically, growth rate of the close-packed (111) crystal plane of the epitaxial layer 230 is much greater than growth rates of other crystal planes of the epitaxial layer 230. The epitaxial layer 230 is therefore grown from the facets 230*a*, 230*b*, 230*c*, 230*d*, 230*e*, 230*f*, 230*g*, and 230*h* covering the S/D portions 222*b*. In the depicted embodiment, the selective growth of the epitaxial layer 230 over each fin 212 continues until the epitaxial layer 230 vertically extends a distance above the S/D portions 222*b* of the upper portions 222 of the fins 212 and laterally extends a space $S_1$ less than 1 nm from each other over the top surfaces 216*t* of the insulation layer 216, thereby forming a cavity 240 between the adjacent epitaxial layers 230.

In the depicted embodiments, the epitaxial layer 230 may comprise a single layer or multilayer structure. In the single-layer embodiment, the epitaxial layer 230 may comprise a silicon-containing material. In some embodiments, the silicon-containing material comprises SiP, SiC, or SiGe. In one embodiment, the epitaxial layer 230, such as silicon carbon (SiC), is epi-grown by a LPCVD process to form the S/D regions of the n-type FinFET. The LPCVD process is performed at a temperature of about 400° to 800° C. and under a pressure of about 1 to 200 Torr, using $Si_3H_8$ and $SiH_3CH$ as reaction gases. In another embodiment, the epitaxial layer 230, such as silicon germanium (SiGe), is epi-grown by a LPCVD process to form the S/D regions of the p-type FinFET. The LPCVD process is performed at a temperature of about 400° to 800° C. and under a pressure of about 1 to 200 Torr, using $SiH_4$ and $GeH_4$ as reaction gases.

In the multilayer embodiment, the epitaxial layer 230 may further comprise a II-VI semiconductor material or a III-V semiconductor material between the silicon-containing material and the S/D portions 222*b* of the upper portions 222 of the semiconductor fins 212. In some embodiments, the II-VI semiconductor material comprises a material selected from the group consisting of ZeSe, ZnO, CdTe, and ZnS. In some embodiments, the III-V semiconductor material comprises a material selected from the group consisting of GaAs, InAs, InGaAs, AlAs, AlGaAs, InP, AlInP, InGaP, GaN, AlGaN, InN, InGaN, InSb, InGaAsSb, InGaAsN, and InGaAsP. In the depicted embodiment, the epitaxial layer 230, such as gallium arsenide (GaAs), is epi-grown by a metal-organic chemical vapor deposition (MOCVD) process. The MOCVD process is performed at a temperature of about 400° C. to 500° C., using trimethylgallium (TMGa) and monogerman ($GeH_4$) as reaction gases.

The process steps up to this point have provided the substrate 202 having the epitaxial layer 230 over each fin 212 laterally extending a space $S_1$ less than 1 nm from each other over the top surfaces 216*t* of the insulation layer 216. Conventionally, silicide regions over the epitaxial layer 230 may be formed by blanket depositing a thin layer of metal material, such as nickel, titanium, cobalt, and combinations thereof. The substrate 202 is then heated, which causes silicon to react with the metal where contacted. After the reaction, a layer of metal silicide is formed between the silicon-containing material and the metal. The un-reacted metal is selectively removed through the use of an etchant that attacks the metal material but does not attack silicide. However, the small space between the adjacent epitaxial layers 230 may impede metal material from entering into the cavity 240, resulting in silicide formation in an upper portion of the epitaxial layers 230 but no silicide formation in a bottom portion of the epitaxial layers 230. This non-uniform distribution of silicide on epitaxial layers 230 (i.e., strained materials) causes high contact resistance of S/D regions of the FinFET and thus degrades the device performance.

Accordingly, the processing discussed below with reference to FIGS. 9A-9B may remove at least a lateral portion of the epitaxial layers 230 to enlarge the space between the adjacent epitaxial layers 230 to make it easier for metal depositions into the cavity 240. This can help silicide formation in the bottom portion of the epitaxial layers 230, thereby fabricating low contact resistance of S/D regions of the FinFET 200 and thus upgrading device performance.

Figure 9A:
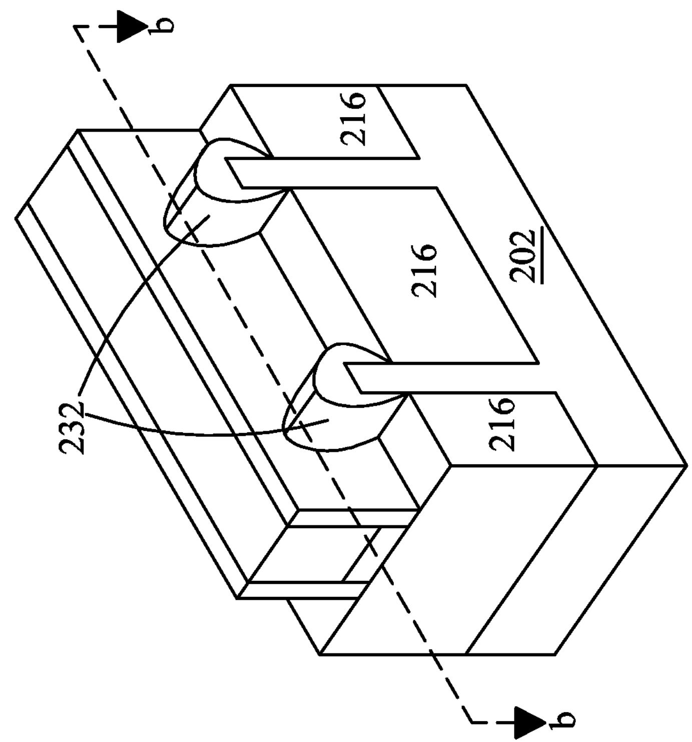
Figure 9B:
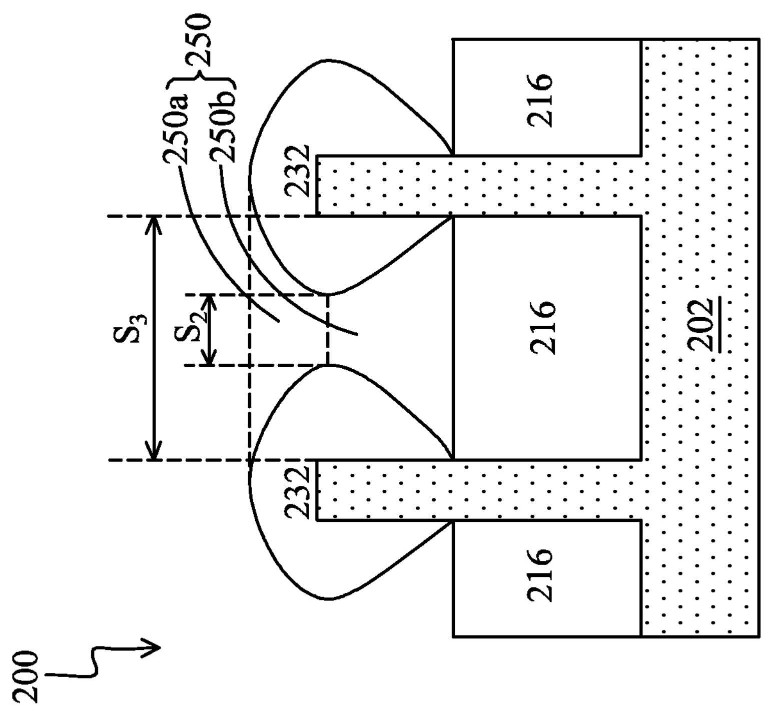

FIG. 9A is a perspective view of the FinFET 200 at one of the various stages of fabrication according to an embodiment, and FIG. 9B is a cross-sectional view of a FinFET taken along the line b-b of FIG. 9A. The structures depicted in FIGS. 9A and 9B are produced by annealing the substrate 202 to have each fin 212 covered by a bulbous epitaxial layer 232 defining an hourglass shaped cavity 250 between adjacent fins 212, the cavity 250 comprising upper and lower portions 250*a*, 250*b*. In the depicted embodiments, facets 230*a*, 230*b*, 230*c*, 230*d*, 230*e*, 230*f*, 230*g*, and 230*h* of the epitaxial layer 230 are rounded to form the bulbous epitaxial layer 232. The bulbous epitaxial layer 232 thus laterally extends a space $S_2$ greater than the space $S_1$ from each other over the top surfaces 216*t* of the insulation layer 216. The greater space $S_2$ make it easier for metal depositions into the hourglass shaped cavity 250. In one embodiment, a minimum width (i.e., the space $S_2$) of the hourglass shaped cavity is from about 3 nm to about 10 nm. In another embodiment, a ratio of a minimum width (i.e., the space $S_2$) of the hourglass shaped cavity 250 to a maximum width $S_3$ of the hourglass shaped cavity 250 is from about 0.1 to about 0.5.

In some embodiments, the step of annealing the substrate 202 to have each fin 212 covered by a bulbous epitaxial layer 232 is performed at a temperature between about 800° C. to 1100° C. and under a pressure of about 5 Torr to 760 Torr and a flow rate of about 5 sccm to 200 sccm, using $H_2$ or $D_2$ as a reaction gas. In alternative embodiments, the step of annealing the substrate 202 to have each fin 212 covered by a bulbous epitaxial layer 232 may further comprise flowing a carrier gas over the substrate 202. In some embodiments, the carrier gas comprises $N_2$, He, or Ar.

Figure 10:
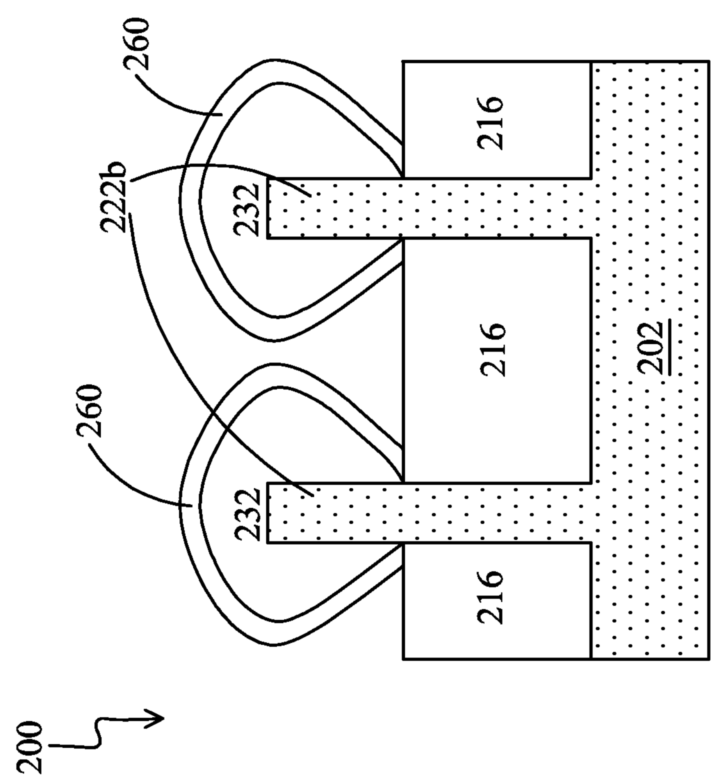

FIGS. 10-14B also are cross-sectional views of the FinFET 200 taken along the line b-b of FIG. 9A at one of the various stages of fabrication according to an embodiment. Referring to FIG. 10, after formation of the bulbous epitaxial layer 232, a first metal material 260 is formed over the bulbous epitaxial layer 232 to a thickness of between about 15 and 60 angstroms. In the depicted embodiment, the first metal material 260 comprises a material selected from the group consisting of titanium, cobalt, nickel, platinum, erbium, and palladium. The first metal material 260 may be formed by CVD, PVD, plating, ALD, or other suitable technique.

Then, the structures depicted in FIGS. 11A-12B are produced by annealing the substrate 202 to convert the bulbous epitaxial layer 232 bordering the lower portion 250*b* of the cavity 250 to silicide 262. In other words, the first metal material 260 in contact with the bulbous epitaxial layer 232 is then transformed into the silicide 262 by a thermal process, such as a rapid thermal anneal (RTA) process. In one embodiment, the silicide 262 is conformal if the bulbous epitaxial layer 232 is partially transformed into the silicide 262. In another embodiment, the silicide 262 is uniform if the bulbous epitaxial layer 232 is fully transformed into the silicide 262. In the single-layer embodiment, the silicide 262 may be conformal or uniform. In the multilayer embodiment, the silicide 262 is conformal and over the II-VI semiconductor material or III-V semiconductor material.

Figure 11B:
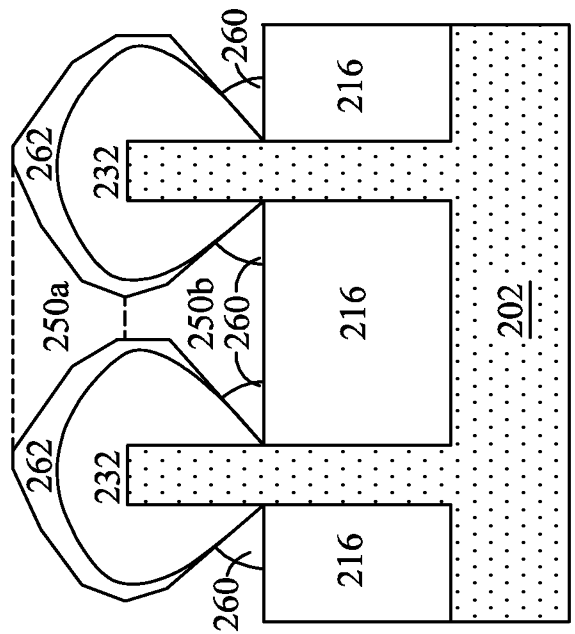
Figure 11A:
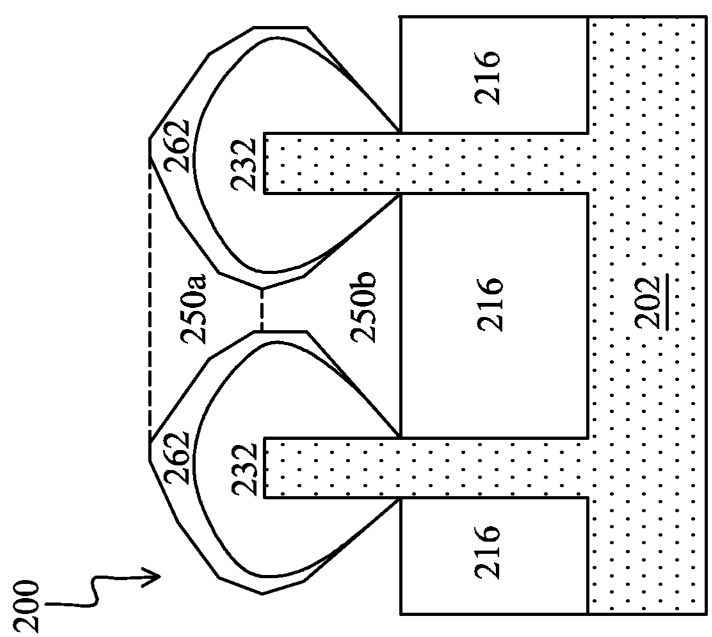

In the conformal embodiment, the structures depicted in FIGS. 11A and 11B are produced by annealing the substrate 202 to convert the bulbous epitaxial layer 232 bordering the lower portion 250*b* of the cavity 250 to silicide 262, wherein the bulbous epitaxial layer 232 bordering the upper portion 250*a* of the cavity 250 is converted to silicide 262 thicker than the silicide 262 bordering the lower portion 250*b* of the cavity 250. In some embodiments, the silicide 262 comprises a material selected from the group consisting of titanium silicide, cobalt silicide, nickel silicide, platinum silicide, erbium silicide, and palladium silicide.

In the conformal embodiment, a first RTA process is applied to the substrate 202 at a temperature between about 200° C. and 300° C. and for between about 10 and 20 seconds. The first metal material 260 in contact with the bulbous epitaxial layer 232 will form a high-resistance silicide. Then, the remaining un-reacted first metal material 260 may be etched away using, for example, a solution comprising $NH_4OH$, $H_2O_2$, and deionized water. In order to transform the high-resistance silicide to a low-resistance silicide 262, a second RTA process is applied to the substrate 202 at a temperature between about 300° C. and 500° C. and for between about 10 and 30 seconds (shown in FIG. 11A). In at least one alternative embodiment, if the remaining un-reacted first metal material 260 is not fully etched away, the lower portion 250*b* of the cavity 250 comprises the first metal material 260 below the silicide 260 bordering the lower portion 250*b* of the cavity 250 (shown in FIG. 11B).

Figure 12B:
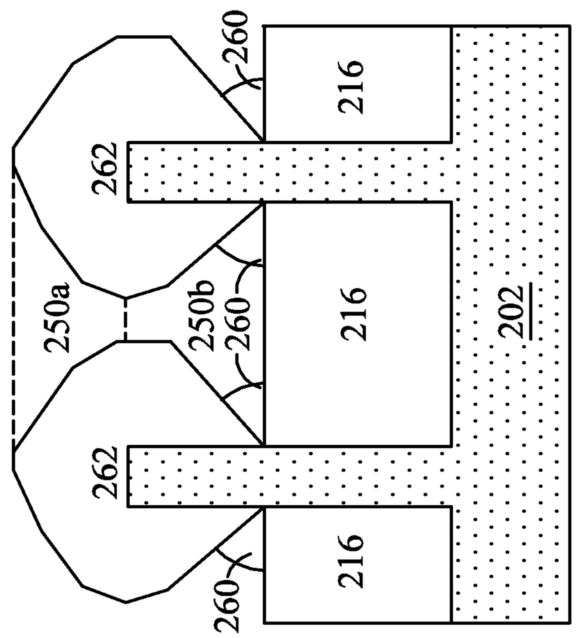
Figure 12A:
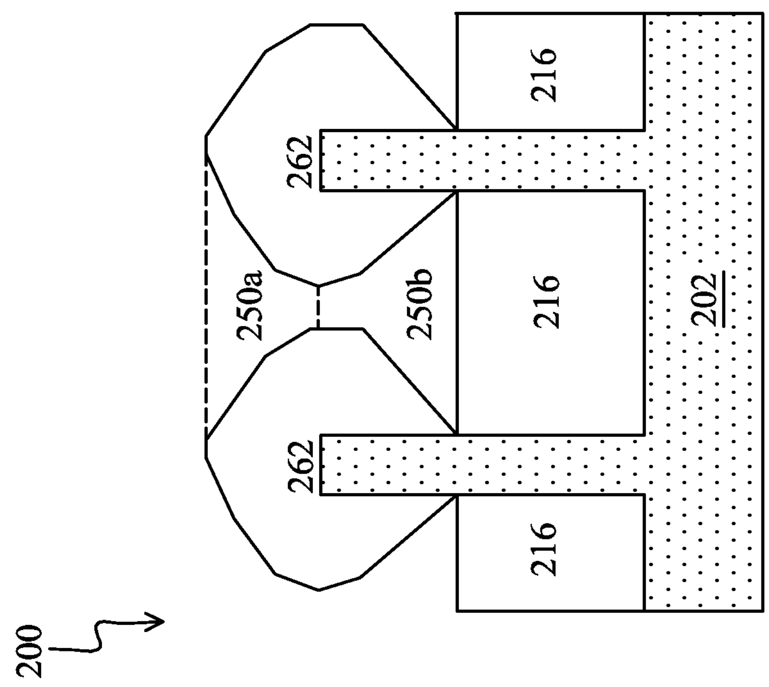
Figure 13B:
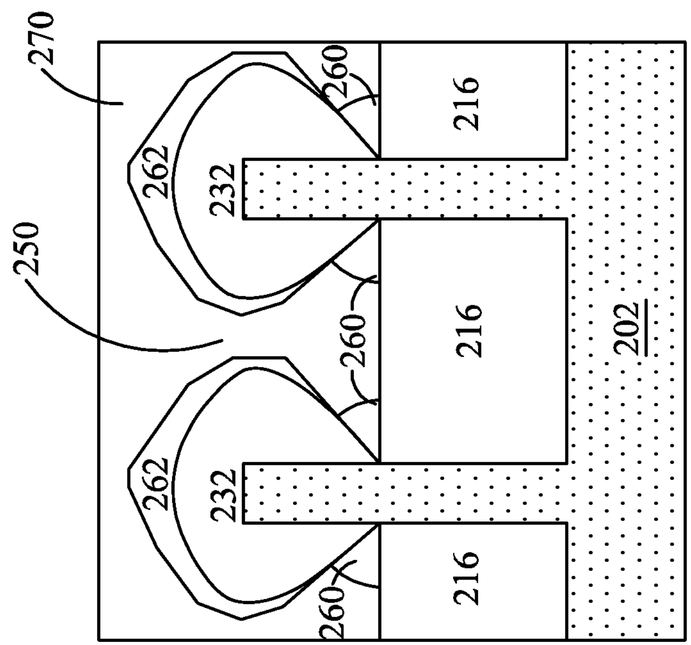
Figure 13A:
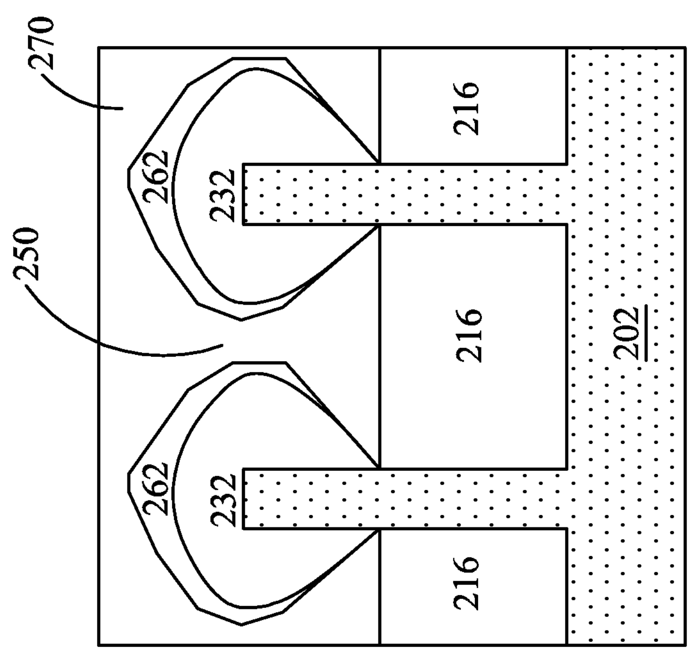
Figure 14B:
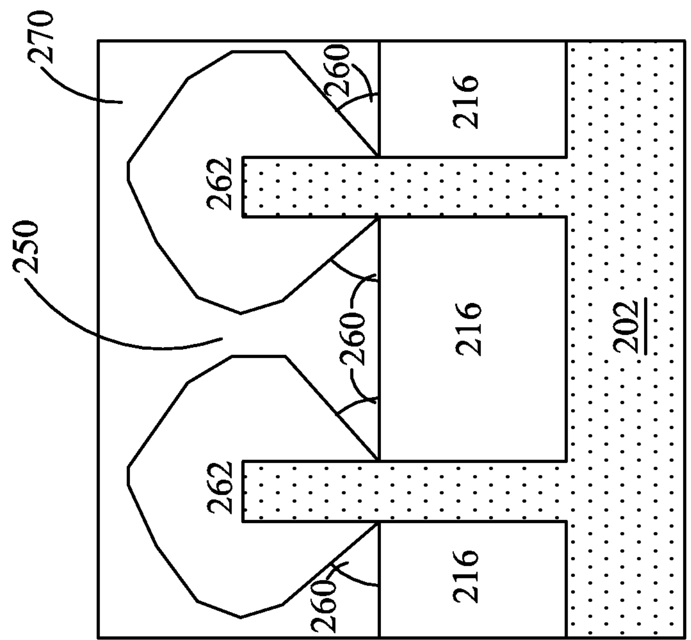
Figure 14A:
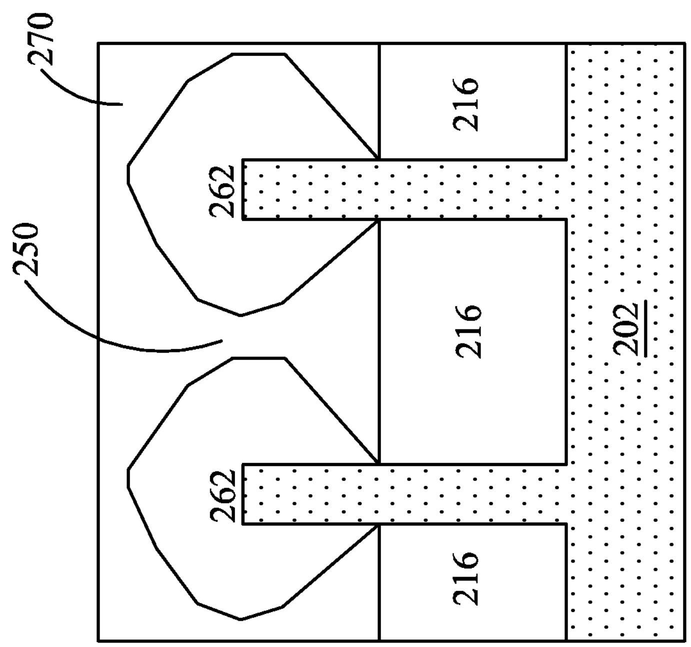

In the uniform embodiment, the structures depicted in FIGS. 12A and 12B are produced by annealing the substrate 202 to convert the bulbous epitaxial layer 232 bordering the lower portion 250*b* of the cavity 250 to silicide 262, wherein the bulbous epitaxial layer 232 bordering the lower portion 250*b* of the cavity 250 is fully converted to silicide 262. In some embodiments, the silicide 262 comprises a material selected from the group consisting of titanium silicide, cobalt silicide, nickel silicide, platinum silicide, erbium silicide, and palladium silicide.

In the uniform embodiment, a first RTA process is applied to the substrate 202 at a temperature between about 200° C. and 300° C. and for between about 10 and 30 seconds. The first metal material 260 in contact with the bulbous epitaxial layer 232 will form a high-resistance silicide. Then, the remaining un-reacted first metal material 260 may be etched away using, for example, a solution comprising $NH_4OH$, $H_2O_2$, and deionized water. In order to transform the high-resistance silicide to a low-resistance silicide 262, a second RTA process is applied to the substrate 202 at a temperature between about 300° C. and 500° C. and for between about 30 and 60 seconds (shown in FIG. 12A). In alternative embodiment, if the remaining un-reacted first metal material 260 is not fully etched away, the lower portion 250*b* of the cavity 250 comprises the first metal material 260 below the silicide 262 bordering the lower portion 250*b* of the cavity 250 (shown in FIG. 12B).

FIGS. 13A, 13B, 14A, and 14B show the FinFETs 200 of FIGS. 11A, 11B, 12A, and 12B after depositing a second metal material 270 over the silicide 262 and top surface 216*t* of the insulation layer 216 to fill the upper portion 250*a* and lower portion 250*b* of the cavity 250, i.e., the upper and lower portions 250*a*, 250*b* of the cavity 250 comprises the second metal material 270. In the depicted embodiment, the second metal material 270 comprises Al, Cu, or W. In some embodiments, the second metal material 270 may be formed by CVD, PVD, ALD, or other suitable technique.

It is understood that the FinFET 200 may undergo further CMOS processes to form various features such as contacts/vias, interconnect metal layers, dielectric layers, passivation layers, etc. Thus, Applicants' method can help silicide formation in the bottom portion of the epitaxial layers, thereby fabricating low contact resistance of S/D regions of the FinFET 200 and thus upgrading device performance.

One aspect of this description relates to a method of fabricating a fin field effect transistor (FinFET) comprising forming a first fin and a second fin extending upward from a substrate major surface to a first height, forming an insulation layer comprising a top surface extending upward from the substrate major surface to a second height less than the first height, selectively forming a bulbous epitaxial layer covering a portion of each fin, annealing the substrate to convert at least a portion of the bulbous epitaxial layer to silicide and depositing a metal layer at least in the cavity. The first fin and the second fin are adjacent. A portion of the first fin and a portion of the second fin extend beyond the top surface of the insulation layer. The bulbous epitaxial layer defines an hourglass shaped cavity between adjacent fins.

Another aspect of this description relates to a method for fabricating a fin field effect transistor (FinFET) comprising forming a first fin and a second fin, selectively forming a bulbous epitaxial layer covering the first fin and the second fin, converting at least a portion of the bulbous epitaxial layer to silicide and depositing a metal layer at least in the cavity. The first fin is adjacent to the second fin. The first fin and second fin extend upward from a substrate major surface. The bulbous epitaxial layer defines an hourglass shaped cavity between the first fin and the second fin.

Still another aspect of this description relates to a method of fabricating a fin field effect transistor (FinFET) comprising forming a first fin and a second fin, selectively forming a bulbous epitaxial layer to partially cover the first fin and the second fin, forming a metal material over the bulbous epitaxial layer, annealing the substrate to at least partially convert the bulbous epitaxial layer bordering the lower portion of the cavity to silicide and depositing a second metal material in a lower portion of the cavity. The first fin is adjacent to the second fin. The first fin and second fin extend upward from a substrate major surface. The bulbous epitaxial layer defines an hourglass shaped cavity between each fin.

While the disclosure has been described by way of example and in terms of specific embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a fin field effect transistor (FinFET) comprising:

forming a first fin and a second fin extending upward from a substrate major surface to a first height, wherein the first fin and the second fin are adjacent;

forming an insulation layer comprising a top surface extending upward from the substrate major surface to a second height less than the first height, wherein a portion of the first fin and a portion of the second fin extend beyond the top surface of the insulation layer;

selectively forming a bulbous epitaxial layer covering a portion of each fin, wherein the bulbous epitaxial layer defines an hourglass shaped cavity between the first and second fins, wherein the hourglass cavity at its narrowest point provides a gap between the bulbous epitaxial layer of the first fin and the bulbous epitaxial layer of the second fin;

depositing a first metal layer on the bulbous epitaxial layer;

annealing the substrate and the first metal layer to convert at least a portion of the bulbous epitaxial layer and at least a portion of the first metal layer to silicide;

after the annealing, etching a portion of the first metal material in the hourglass cavity, wherein the portion is unreacted first metal material; and after annealing, depositing a second metal layer within the hourglass cavity.

2. The method of claim 1, wherein annealing the substrate to convert at least a portion of the bulbous epitaxial layer to silicide comprises performing a first rapid thermal anneal to the substrate at a temperature between about 200° C. to 300° C.

3. The method of claim 2, wherein the first rapid anneal to the substrate is performed for a time between about 10 seconds to 30 seconds.

4. The method of claim 2, wherein annealing the substrate to convert at least a portion of the bulbous epitaxial layer to silicide further comprises performing a second rapid thermal anneal to the substrate at a temperature between about 300° C. to 500° C.

5. The method of claim 4, wherein the second rapid anneal to the substrate is performed for a time between about 30 seconds to 60 seconds.

6. A method of fabricating a fin field effect transistor (FinFET) comprising:

forming a first fin and a second fin, wherein:

the first fin is adjacent to the second fin, and the first fin and second fin extend upward from a substrate major surface;

selectively forming a bulbous epitaxial layer covering each of the first fin and the second fin, wherein a separation between the bulbous epitaxial layer of the first fin and the bulbous epitaxial layer of the second fin defines an hourglass shaped cavity between the first fin and the second fin;

converting at least a portion of the bulbous epitaxial layer to silicide, wherein after the converting, a gap remains between a narrowest point between the silicide of the first fin and the silicide of the second fin; and after converting, depositing a metal layer over the silicide, within the cavity and within the gap.

7. The method of claim 6, wherein selectively forming the bulbous epitaxial layer comprises:

selectively growing an epitaxial layer covering each fin, wherein the epitaxial layer comprises a plurality of edges; and rounding each of the edges of the epitaxial layer.

8. The method of claim 7, wherein rounding each of the edges of the epitaxial layer comprises annealing the substrate to have each fin covered by the bulbous epitaxial layer.

9. The method of claim 8, wherein annealing the substrate to have each fin covered by the bulbous epitaxial layer is performed at a temperature between about 800° C. to 1100° C.

10. The method of claim 8, wherein annealing the substrate to have each fin covered by the bulbous epitaxial layer is performed under a pressure of about 5 Torr to 760 Torr.

11. The method of claim 8, wherein annealing the substrate to have each fin covered by the bulbous epitaxial layer is performed at a flow rate of about 5 sccm to 200 sccm.

12. The method of claim 8, wherein annealing the substrate to have each fin covered by the bulbous epitaxial layer is performed using $H_2$ or $D_2$ as a reaction gas.

13. The method of claim 12, further comprising flowing a carrier gas over the substrate.

14. The method of claim 13, wherein the carrier gas comprises $N_2$, He, or Ar.

15. A method of fabricating a fin field effect transistor (FinFET) comprising:

forming a first fin and a second fin, wherein:

the first fin is adjacent to the second fin, and the first fin and second fin extend upward from a substrate major surface;

selectively forming a first bulbous epitaxial layer to partially cover the first fin and a second bulbous epitaxial layer to partially cover the second fin, wherein the bulbous epitaxial layer defines an hourglass shaped cavity between each fin, and the cavity comprises a lower portion defining by a lower portion of a sidewall the first bulbous epitaxial layer and a lower portion of a sidewall of the second bulbous epitaxial layer;

forming a first metal material over the bulbous epitaxial layer including directly on the lower portion of the sidewall of the first bulbous epitaxial layer and directly on the lower portion of the sidewall of the second bulbous epitaxial layer; and annealing the substrate to at least partially convert the bulbous epitaxial layer bordering the lower portion of the cavity to silicide using the first metal material.

16. The method of claim 15, wherein annealing the substrate to partially convert the bulbous epitaxial layer to silicide comprises performing a first rapid thermal anneal to the substrate at a temperature between about 200° C. to 300° C.

17. The method of claim 16, wherein the first rapid thermal anneal to the substrate is performed for a time between about 10 seconds to 20 seconds.

18. The method of claim 16, wherein annealing the substrate to partially convert the bulbous epitaxial layer to silicide further comprises performing a second rapid thermal anneal performed at a temperature between about 300° C. to 500° C.

19. The method of claim 18, wherein the second rapid thermal anneal to the substrate is performed for a time between about 10 seconds to 30 seconds.

* * * * *